United States Patent
Choi et al.

(10) Patent No.: US 8,368,198 B2
(45) Date of Patent: Feb. 5, 2013

(54) STACKED PACKAGE OF SEMICONDUCTOR DEVICE

(75) Inventors: Jun-Young Choi, Seoul (KR); Kilsoo Kim, Hwaseong-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 127 days.

(21) Appl. No.: 12/941,640

(22) Filed: Nov. 8, 2010

(65) Prior Publication Data

US 2011/0180937 A1    Jul. 28, 2011

(30) Foreign Application Priority Data

Jan. 22, 2010  (KR) .................. 10-2010-0006126

(51) Int. Cl.
    *H01L 23/22*    (2006.01)
(52) U.S. Cl. ............... 257/686; 257/687; 257/E23.015
(58) Field of Classification Search .............. 257/686, 257/687, E23.015
    See application file for complete search history.

(56) References Cited

U.S. PATENT DOCUMENTS

| | | | |
|---|---|---|---|
| 2007/0246807 A1* | 10/2007 | Hara et al. | ............ 257/666 |
| 2008/0150100 A1 | 6/2008 | Hung et al. | |
| 2008/0303131 A1 | 12/2008 | McElrea et al. | |

FOREIGN PATENT DOCUMENTS

JP    2008-205143    4/2008

* cited by examiner

*Primary Examiner* — Marc Armand
*Assistant Examiner* — Eva Yan Montalvo
(74) *Attorney, Agent, or Firm* — Harness, Dickey & Pierce, P.L.C.

(57) ABSTRACT

Provided is a stacked package of a semiconductor device and a method of manufacturing the same. The stacked package of a semiconductor device may include at least one first semiconductor chip, at least one second semiconductor chip, at least one interposer between the at least one first semiconductor chip and the at least one second semiconductor chip, and a third semiconductor chip on the at least one first semiconductor chip. The at least one first semiconductor chip and the at least one second semiconductor chip may be configured to perform a first function and a second function and each may include a plurality of bonding pads. The third semiconductor chip may be configured to perform a third function which is different from the first and the second functions. The package may further include external connection leads may be configured to electrically connect the third semiconductor chip to the outside.

18 Claims, 15 Drawing Sheets

STACKED PACKAGE OF SEMICONDUCTOR DEVICE

CROSS-REFERENCE TO RELATED APPLICATIONS

This U.S. non-provisional patent application claims priority under 35 U.S.C. §119 to Korean Patent Application No. 10-2010-0006126, filed on Jan. 22, 2010, in the Korean Intellectual Property Office (KIPO), the entire contents of which are herein incorporated by reference.

BACKGROUND

1. Field

Example embodiments relate to a stacked package of a semiconductor device and a method of manufacturing the same, and more particularly, to a semiconductor stacked package having a both sides stacked lead frame structure and a method of manufacturing the same.

2. Description of the Related Art

In the conventional art, the size and weight of semiconductor devices are relatively small in order to satisfy user demands for relatively small and light weight electronic devices. In the conventional art, some semiconductor devices have a plurality of semiconductor devices manufactured as one element product. To manufacture the plurality of semiconductor devices as the one element product, a multi-chip package in which a plurality of semiconductor chips is stacked and connected to each other is being manufactured. The multi-chip package is divided into a BGA package type including a ball and a lead frame package type in which chips may be stacked on both sides to reduce manufacturing costs and thus a large number of chips may be stacked.

SUMMARY

The present disclosure provides a stacked package structure of a semiconductor in which semiconductor chips are effectively stacked on both surfaces.

The present disclosure also provides a method of manufacturing a stacked package of a semiconductor device adapted for providing the stacked package of the semiconductor device.

In accordance with example embodiments, a stacked package of a semiconductor device may include at least one first semiconductor chip, at least one second semiconductor chip, at least one interposer between the at least one first semiconductor chip and the at least one second semiconductor chip, and a third semiconductor chip on the at least one first semiconductor chip. In example embodiments, the at least one first semiconductor chip may be configured to perform a first function and the at least one first semiconductor chip may include a first plurality of bonding pads. In example embodiments the at least one second semiconductor chip may be configured to perform a second function and the at least one second semiconductor chip may be arranged under the at least one first semiconductor chip and may include a second plurality of bonding pads. The third semiconductor chip may be configured to perform a third function which is different from the first and the second functions and the third semiconductor chip may be arranged on the first semiconductor chip and including a third plurality of bonding pads. In example embodiments, external connection leads may be configured to electrically connect the third plurality of bonding pads to an outside and a wire bonding unit may electrically connect the at least one first semiconductor chip, the at least one second semiconductor chip, the third semiconductor chip, the at least one interposer lead, and the external connection leads to each other. In example embodiments, the at least one interposer lead may be configured to provide an electrical connection media between the at least one first semiconductor chip and the at least one second semiconductor chip.

In accordance with example embodiments, a method for manufacturing a stacked package of a semiconductor device may include providing at least one interposer lead, providing at least one first semiconductor chip on one surface of the at least one interposer lead, the at least one first semiconductor chip including a first plurality of bonding pads, providing at least one second semiconductor chip on another surface of the at least one interposer lead, the at least one second semiconductor chip including a second plurality of bonding pads, providing a third semiconductor chip on the at least one first semiconductor chip, the third semiconductor chip including a third plurality of bonding pads, electrically connecting the first, second, and third plurality of bonding pads to each other using an electrical connection unit and connecting the first and second plurality of bonding pads to the at least one interposer lead using the electrical connection unit, connecting the third plurality of bonding pads to an external connection lead using the electrical connection unit, and covering the at least one first semiconductor chip, the at least one second semiconductor chip, the at least one third semiconductor chip, the at least one interposer lead, and at least a portion of the external connection lead with a mold material.

Example embodiments provide stacked packages of a semiconductor device, the staked packages may include interposer leads electrically separated from each other, at least one first semiconductor chip disposed on one surface of the respective interposer leads, the at least one first semiconductor chip including a plurality of bonding pads, at least one second semiconductor chip disposed on the other surface of the respective interposer leads, the at least one second semiconductor chip including a plurality of bonding pads, a third semiconductor chip disposed on the first semiconductor chip and including a plurality of bonding pads, the third semiconductor chip having a function different from those of the first and second semiconductor chips; external connection leads electrically connecting the bonding pads of the third semiconductor chip to the outside, and a wire boding unit electrically connecting the first semiconductor chip, the second semiconductor chip, the third semiconductor chip, the interposer leads, and the external connection leads to each other, wherein the interposer leads are provided as electrical connection media between the first semiconductor chip and the second semiconductor chip.

In example embodiments, the first semiconductor chip and the second semiconductor chip may include memory semiconductors, respectively. Also, the third semiconductor chip may include a memory controller semiconductor.

In example embodiments, the external connection lead serving as a power source among the external connection leads may be directly connected to a corresponding power bonding pad among the bonding pads of the first semiconductor chip or the second semiconductor chip using a bonding wire.

In example embodiments, the external connection lead serving as a power source among the external connection leads may be directly connected to the interposer lead serving as a power source among the interposer leads using a bonding wire.

In example embodiments, the external connection lead serving as a power source among the external connection leads may be integrated with the interposer lead serving as a power source among the interposer leads.

In example embodiments, the stacked packages may further include a molding resin that covers a portion of the respective external connection leads, the first semiconductor chip, the second semiconductor chip, the third semiconductor chip, and the interposer leads.

In example embodiments, each of the first semiconductor chip and the second semiconductor chip may be provided in plurality, and the first semiconductor chips and the second semiconductor chips may be stacked in an off-set stair type, respectively.

In example embodiments, the wire bonding unit may be configured to perform a jumping bonding process through which the bonding pads are connected to each other.

In example embodiments, in each of the first semiconductor chip and the second semiconductor chip, the bonding pads may be aligned in a row along an edge in an edge region of a surface opposite to that facing the respective interposer leads in the first semiconductor chip or the second semiconductor chip.

In example embodiments, at least one bonding pad of the first semiconductor chip, the second semiconductor chip, and the third semiconductor chip may include a redistributed layout pad fowled by a redistributed layout of a chip pad manufactured during a wafer level process.

In example embodiments, dummy bonding pads may be further disposed on the first semiconductor chip adjacent to the third semiconductor chip, and the dummy bonding pads may be directly electrically connected to the respective bonding pads of the third semiconductor chip and the respective external connection leads.

In example embodiments, the respective interposer leads may have a bar shape, and the interposer leads may be spaced from each other and disposed in a raw along a direction perpendicular to a longitudinal direction of the respective interposer leads.

In example embodiments, the first semiconductor chips may be off-set toward one end of the respective interposer leads as the first semiconductor chips are away from the respective interposer leads, and the second semiconductor chips may be off-set toward the other end of the respective interposer leads as the second semiconductor chips are away from the respective interposer leads.

In example embodiments, the dummy bonding pads may be disposed in an edge region perpendicular to an edge region in which the bonding pads of the first semiconductor chip is disposed among edge regions of the first semiconductor chip.

In accordance with example embodiments, methods for manufacturing a stacked package of a semiconductor device include providing a plurality of interposer leads electrically separated from each other, providing at least one first semiconductor chip on one surface of the respective interposer leads, providing at least one second semiconductor chip on the other surface of the respective interposer leads, stacking a third semiconductor chip on the first semiconductor chip, connecting bonding pads having functions corresponding to the first semiconductor chip, the second semiconductor chip, and the third semiconductor chip to each other using an electrical connection unit and connecting bonding pads of the first semiconductor chip and the second semiconductor chip to the plurality of interposer leads using the electrical connection unit, connecting the bonding pad that performs an input/output operation from the outside in the third semiconductor chip to an external connection lead using the electrical connection unit, and filling a molding resin to cover the first semiconductor chip, the second semiconductor chip, the third semiconductor chip, the interposer leads, and a portion of the external connection lead.

In example embodiments, each of the first semiconductor chip and the second semiconductor chip may be provided in plurality, and the first semiconductor chips and the second semiconductor chips may be stacked, respectively, wherein the first semiconductor chips may be off-set toward one end of the respective interposer leads as the first semiconductor chips are away from the respective interposer leads, and the second semiconductor chips may be off-set toward the other end of the respective interposer leads as the second semiconductor chips are away from the respective interposer leads.

In example embodiments, a wire bonding process for electrically connecting the first semiconductor chips, the second semiconductor chips, and the third semiconductor chips to each other may include a jumping bonding process for connecting the adjacent bonding pads to each other.

In example embodiments, the methods may further include performing a redistributed layout process to form the bonding pads of the first semiconductor chip, the second semiconductor chip, or the third semiconductor chip.

In example embodiments, the external connection lead and the third semiconductor chip may be electrically connected to form dummy bonding pads on the first semiconductor chip adjacent to the third semiconductor chip, wherein the bonding pads of the third semiconductor chip and the dummy bonding pads may be wire-bonded to each other, and the dummy bonding pads and the external connection lead may be wire-bonded to each other.

BRIEF DESCRIPTION OF THE DRAWINGS

The accompanying drawings are included to provide a further understanding of example embodiments, and are incorporated in and constitute a part of this specification. The drawings illustrate example embodiments and, together with the description, serve to explain principles of example embodiments. In the drawings.

DETAILED DESCRIPTION OF THE EMBODIMENTS

Figure 1:
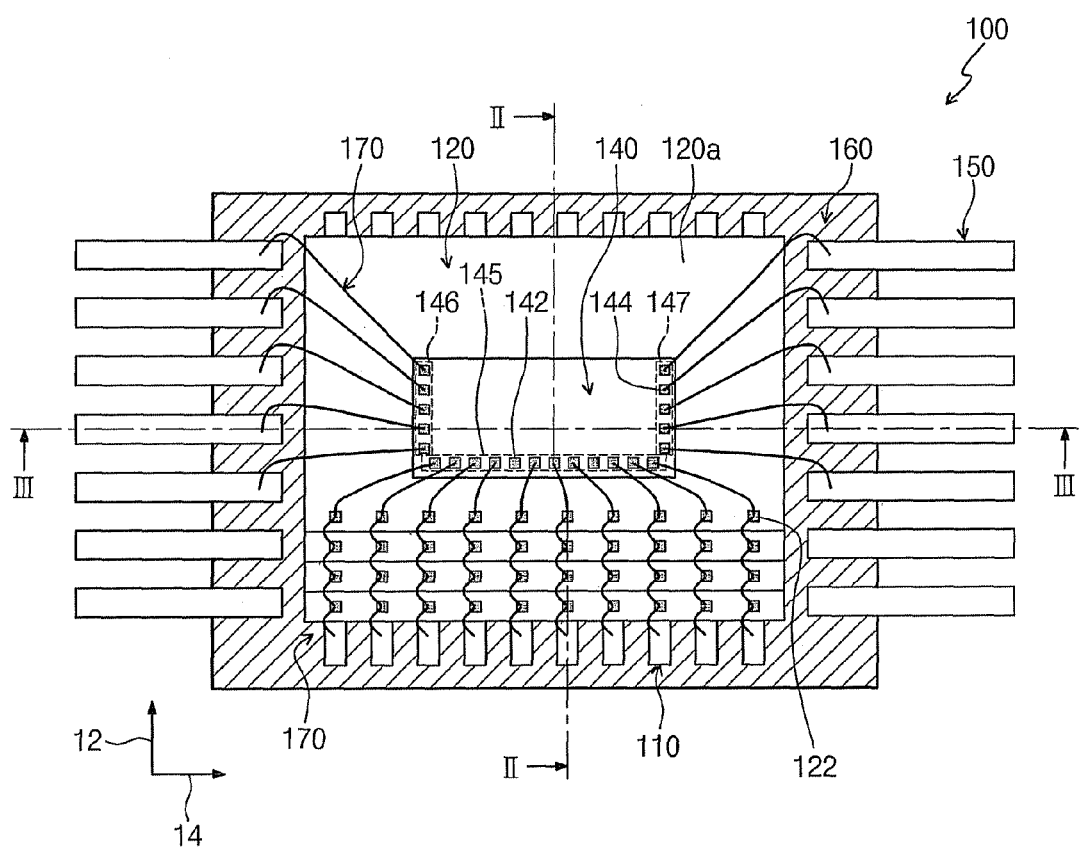
FIG. 1 is a schematic perspective view illustrating a stacked package of a semiconductor device according to example embodiments.

Example embodiments will be described below in more detail with reference to the accompanying drawings.

Example embodiments may, however, be embodied in different forms and should not be construed as limited to the embodiments set forth herein. Rather, example embodiments are provided so that this disclosure will be thorough and complete, and will fully convey the scope of the inventive concepts to those skilled in the art.

Detailed example embodiments are disclosed herein. However, specific structural and functional details disclosed herein are merely representative for purposes of describing example embodiments. Example embodiments may, however, be embodied in many alternate forms and should not be construed as limited to only the embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but to the contrary, example embodiments are to cover all modifications, equivalents, and alternatives falling within the scope of example embodiments. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Hereinafter, example embodiments will be described in detail with reference to the accompanying drawings.

Figure 2:
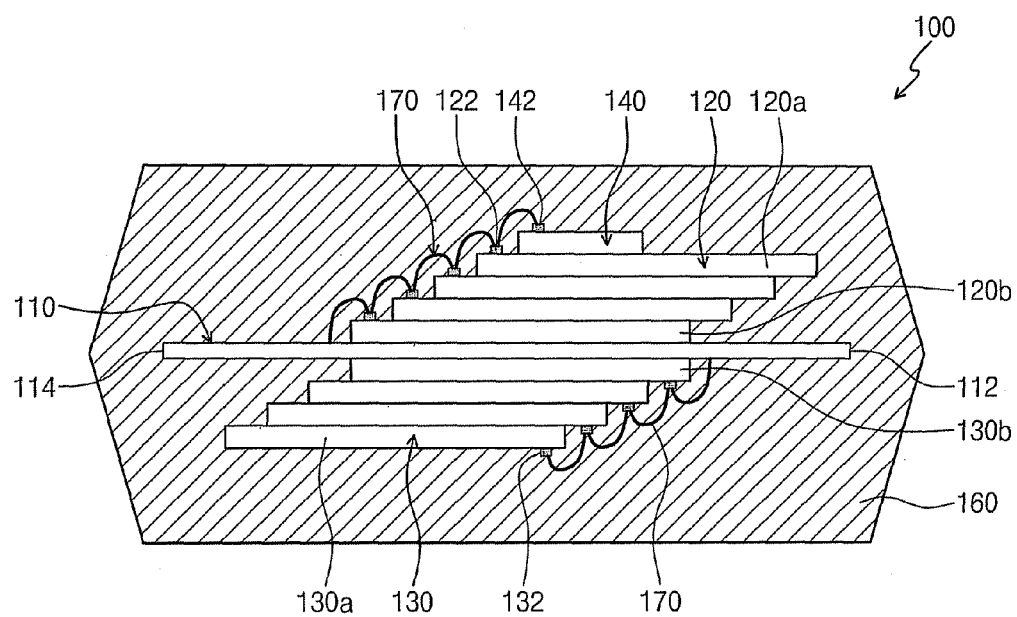
FIG. 2 is a sectional view taken along line II-II of FIG. 1.
Figure 3:
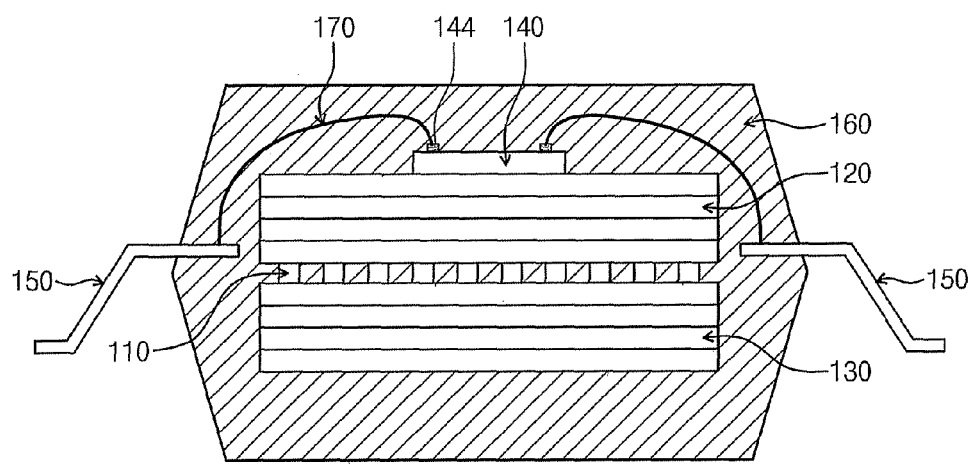
FIG. 3 is a sectional view taken along line of FIG. 1.

FIGS. 1 to 3 are schematic views illustrating a stacked package 100 of a semiconductor device according to example embodiments. FIG. 1 is a plan view illustrating the stacked package 100 of the semiconductor device. FIG. 2 is a sectional view taken along line II-II of FIG. 1, and FIG. 3 is a sectional view taken along line of FIG. 1. Although the molded inside is not substantially visible from the outside in FIG. 1, the inside of the molded portion was illustrated for convenience of description. Hereinafter, for convenience of description, a longitudinal direction of an interposer lead is called a first direction 12, and a direction perpendicular to the first direction 12 when viewed from an upper side is called a second direction 14.

Referring to FIGS. 1 to 3, the stacked package 100 of the semiconductor device may be a package having a lead frame structure. The stacked package 100 of the semiconductor device includes interposer leads 110, first semiconductor chips 120, second semiconductor chips 130, a third semiconductor chip 140, external connection leads 150, and a molding resin 160.

The interposer leads 110 may serve as substrates of the semiconductor chips 120, 130, and 140 disposed inside the stacked package 100 of the semiconductor device. The first semiconductor chips 120 may be stacked on a top surface of the interposer lead 110, and the second semiconductor chips 130 may be stacked on a bottom surface of the interposer lead 110. The first and second semiconductor chips 120 and 130 may perform a data storage function. The first semiconductor chips 120 may have the same number of chips as the second semiconductor chips 130. The third semiconductor chip 140 may be disposed on an uppermost semiconductor chip 120a of the first semiconductor chips 120. Alternatively, the third semiconductor chip 140 may be disposed on a lowermost semiconductor chip 130a of the second semiconductor chips 130. The first semiconductor chips 120 and the second semiconductor chips 130 may be the same kind of chip. The first semiconductor chip 120 and the third semiconductor chip 140 may be different kinds of chips. For example, the first and second semiconductor chips 120 and 130 may be memory semiconductor chips, and the third semiconductor chip 140 may be a memory controller semiconductor chip. The first semiconductor chips 120 may form a NAND flash device, and the third semiconductor chips 140 may form a controller device that controls the NAND flash device. The NAND flash device may be a 3-bit NAND flash. The third semiconductor chip 140 may have a size less than that of the first semiconductor chip 120.

The first semiconductor chips 120 and the second semiconductor chips 130 may include bonding pads 122 and 132, respectively. The bonding pads 122 of the first semiconductor chips 120 may be disposed in an edge region of the first semiconductor chips 120. Also, the bonding pads 122 of the first semiconductor chips 120 may be disposed on a surface opposite to that facing the interposer lead 110 in the first semiconductor chips 120. The bonding pads 122 may be arranged in a row. For example, the bonding pads 122 may be arranged in a direction parallel to the second direction 14. The bonding pads 132 of the second semiconductor chips 130 may have the same arrangement and direction as those of the first semiconductor chips 120. Thus, the bonding pads 132 of the second semiconductor chips 130 may be disposed on a surface opposite to that facing the interposer lead 110 in the second semiconductor chips 130.

The third semiconductor chip 140 may include first bonding pads 142 and second bonding pads 144. The first bonding pads 142 and the second bonding pads 144 may be disposed on a surface of the third semiconductor chip 140 that faces away from the interposer lead 110. The first bonding pads 142 may be disposed in a first edge region 145 of the third semiconductor chip 140, and the second bonding pads 144 may be disposed in a second edge region 146 perpendicular to the first edge region 145. The first bonding pads 142 may be arranged in a row in a direction parallel to the second direction 14. The second bonding pads 144 may be disposed in the second edge region 146 may be arranged in a row in a direction parallel to the first direction 12. Also, the second bonding pads 144 may be additionally arranged in a row in a direction parallel to the first direction 12 in a third edge region 147 facing the second edge region 146.

The interposer leads 110 may be electrically separated from each other. The separated interposer leads 110 may serve as media electrically connecting the bonding pads 122 of the first semiconductor chips 120 to the bonding pads 132 of the second semiconductor chips 130, which may perform the same function. The interposer leads 110 may be provided as many as required in consideration of input/output terminals. The respective interposer leads 110 may have a bar shape. The interposer leads 110 may have the same configuration and size as each other. The interposer leads 110 may be spaced from each other and arranged in a row along the second direction 14. A distance between the interposer leads adjacent to each other may be the same.

The bonding pads 122 of the first semiconductor chip 120b most adjacent to the interposer leads 110 among the first semiconductor chips 120 may be connected to the interposer leads 110 corresponding to the bonding pads 122 by a bonding wire 170 which is an example of an electrical connection unit. The bonding pads 132 of the second semiconductor chip 130b most adjacent to the interposer 110 among the second semiconductor chips 130 may be connected to the interposer 110 corresponding to the bonding pads 132 by the bonding wire 170. Thus, the first and second semiconductor chips 120 and 130 disposed on the surfaces different from each other of the interposer lead 110 may be electrically connected to each other using the interposer lead 110 as a medium. Also, in the bonding pads 122 of the first semiconductor chips 120 adjacent to each other, the bonding pads 122 corresponding to each other may be electrically connected to each other by the bonding wire 170. Similarly, in the bonding pads 132 of the second semiconductor chips 130 adjacent to each other, the bonding pads 132 corresponding to each other may be electrically connected to each other by the bonding wire 170. Also, the first bonding pad 132 of the third semiconductor chip 140 may be electrically connected to the corresponding bonding pad 122 of the first semiconductor chip 120a most adjacent to the third semiconductor chip 140 by the bonding wire 170. The second bonding pad 144 of the third semiconductor chip 140 may be electrically connected to the external connection lead 150 corresponding to the second bonding pads 144 by the bonding wire 170.

Referring again to FIG. 2, the first semiconductor chips may be stacked in an off-set stair type. The bonding of the bonding wire 170 connecting the first semiconductor chips 120 to each other may be a jumping bonding by which the bonding pads 122 of the first semiconductor chips 120 adjacent to each other are connected to each other. The second semiconductor chips 130 may be stacked in an off-set stair type. The bonding of the bonding wire 170 connecting the second semiconductor chips 130 to each other may be a jumping bonding by which the bonding pads 132 of the second semiconductor chip 130 adjacent to each other are connected to each other. The first semiconductor chips 120 may be off-set toward one end 112 of the interposer lead 110 as the first semiconductor chips 120 may be away from the interposer lead 110. Also, the second semiconductor chips 130 may be off-set toward the other end 114 of the interposer lead 110 as the second semiconductor chips 130 are away from the interposer lead 110. The off-set distance among the adjacent first semiconductor chips 120 may be equal and the off-set distance among the adjacent second semiconductor chips 130 may be equal. The first semiconductor chips 120b most adjacent to the interposer lead 110 and the second semiconductor chips 130b most adjacent to the interposer lead 110 may be totally overlapped.

The molding resin 160 may cover the interposer leads 110, the first semiconductor chips 120, the second semiconductor chips 130, the third semiconductor chip 140, a portion of the respective external connection leads 150, and the bonding wires 170.

FIGS. 4 to 9 are views illustrating a process of manufacturing a stacked package 100 of a semiconductor device.

Figure 4:
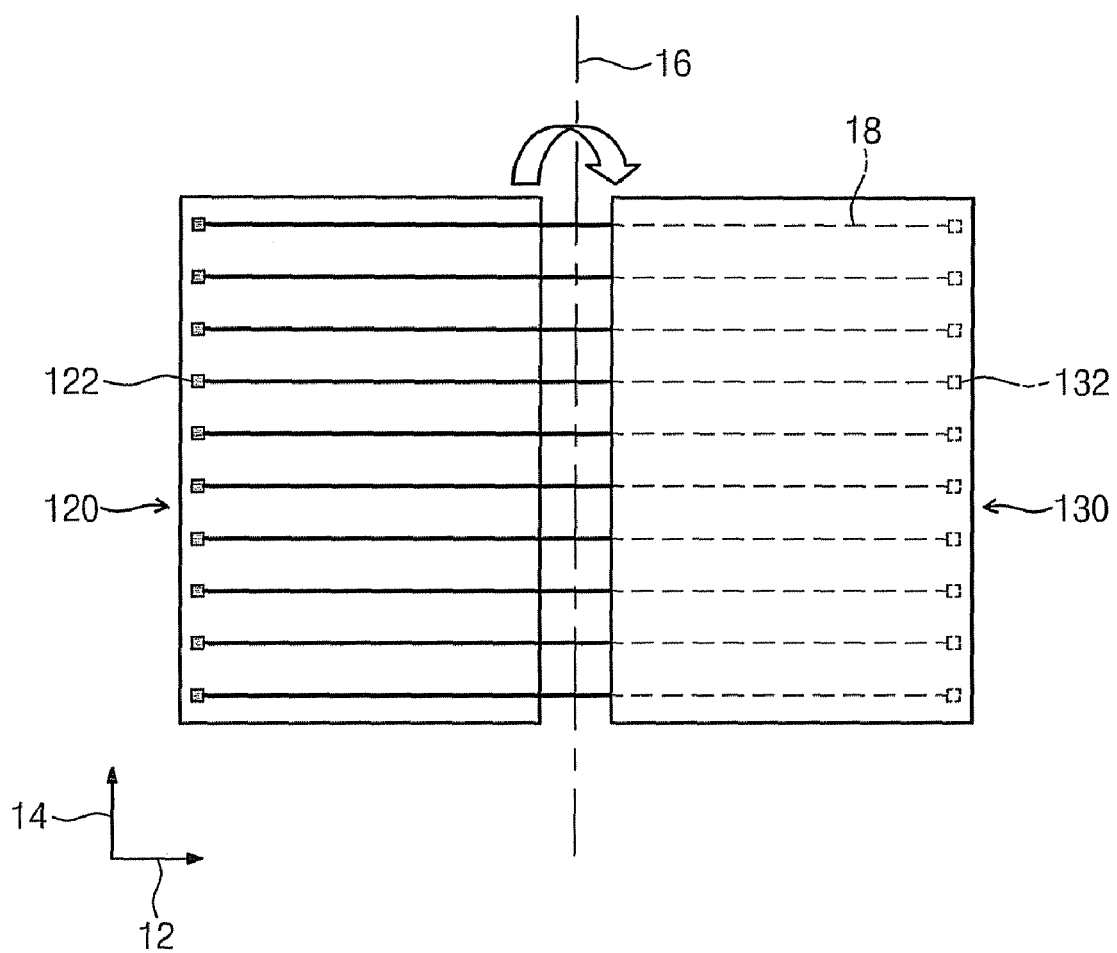
FIGS. 4 to 9 are views illustrating a process of manufacturing a stacked package of a semiconductor device of FIG. 1.
Figure 5:
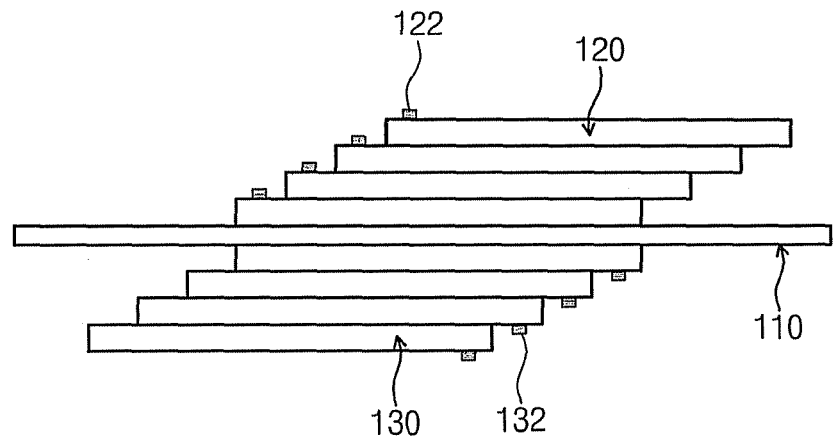
Figure 6:
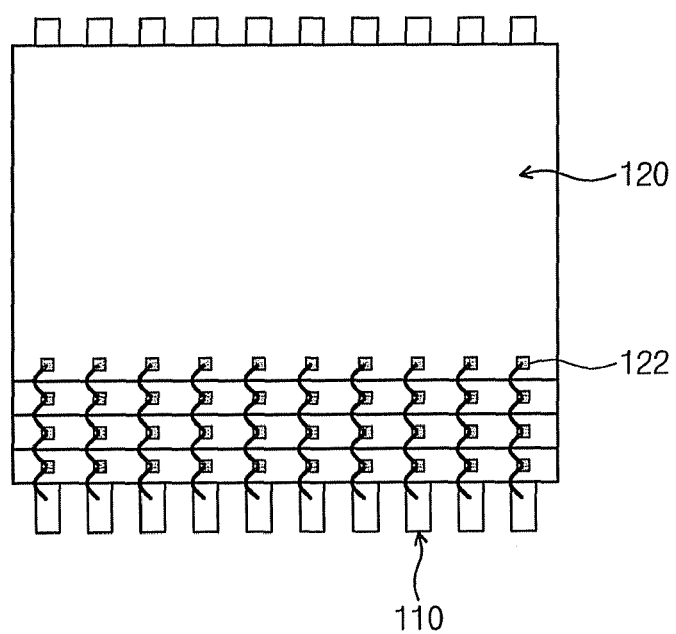

In example embodiments, interposer leads 110 may be arranged in a row along a second direction 14 in a state where the interposer leads 110 are separated from each other. In example embodiments, first semiconductor chips 120 may be provided. The first semiconductor chips 120 may be disposed to allow bonding pads 122 to be disposed on a top surface thereof. The first semiconductor chips 120 may be stacked on the interposer leads 110 to off-set in a first direction with respect to each other. Thus, the first semiconductor chips 120 may be disposed to allow the bonding pads 122 to be disposed on a surface opposite to that facing the interposer lead 110. In example embodiments, second semiconductor chips 130 may be provided. The second semiconductor chips 130 may be the same kind of semiconductor chips 130 as the first semiconductor chips 120. As shown in FIG. 4, the second semiconductor chips 130 may be disposed on a bottom surface of the interposer leads 110 in a state where the second semiconductor chips 120 are rotated at about 180 degrees with respect to a straight line 16 parallel to the second direction 14. The second semiconductor chips 130 may be stacked on the interposer leads 110 to off-set in a first direction 12 with respect to each other. The off-set direction between the first semiconductor chips 120 and the second semiconductor chips 130 may be provided in reverse. The bonding pads 122 and 132 with the same function in the first semiconductor chips 120 and the second semiconductor chips 130 may be located in a straight line 18 parallel to the first direction 12 when viewed from above. Thus, the interposer leads 110, the first semiconductor chips 120, and the second semiconductor chips 130 may be disposed as shown in FIGS. 5 and 6. FIG. 5 is a front view illustrating a relationship between the interposer leads 110, the first semiconductor chips 120, and the second semiconductor chips 130, and FIG. 6 is a plan view of the interposer leads 110, the first semiconductor chips 120, and the second semiconductor chips 130.

Figure 7:
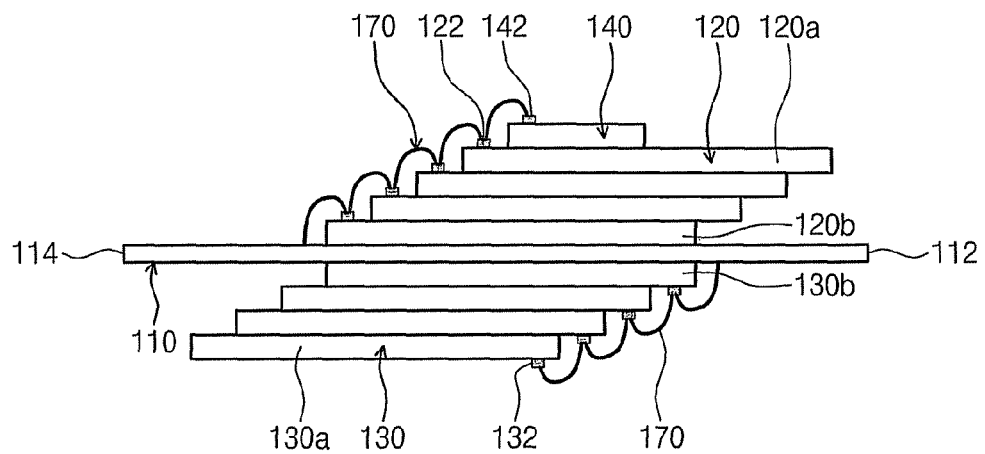

Referring to FIG. 7, a third semiconductor chip 140 may be disposed on the uppermost first semiconductor chip 120a of the first semiconductor chips 120. Although example embodiments illustrate the third semiconductor chip 140 as being disposed on the uppermost first semiconductor chip 120a, example embodiments are not limited thereto. For example, the third semiconductor chip 140 may be disposed on a bottom surface of the lowermost second semiconductor chip 130a of the second semiconductor chips 130.

When the first semiconductor chips 120, the second semiconductor chips 130, and the third semiconductor chip 140 are completely stacked, bonding pads 122 corresponding to the first semiconductor chips 120 adjacent to each other may be connected to each other using a bonding wire 170. Also, bonding pads 132 corresponding to the second semiconductor chips 130 adjacent to each other may be connected to each other using the bonding wire 170. The bonding pad 122 of the uppermost first semiconductor chip 120a may be connected to a corresponding first bonding pad 142 of the third semiconductor chip 140 using the bonding wire 170. The bonding pad 122 of the first semiconductor chip 120b most adjacent to the interposer lead 110 may be connected to the corresponding interposer lead 110 using the bonding wire 170. Also, the bonding pad 132 of the second semiconductor chip 130b most adjacent to the interposer lead 110 may be connected to the corresponding interposer lead 110 using the bonding wire 170. The bonding process may be performed as a jumping bonding process.

Figure 8:
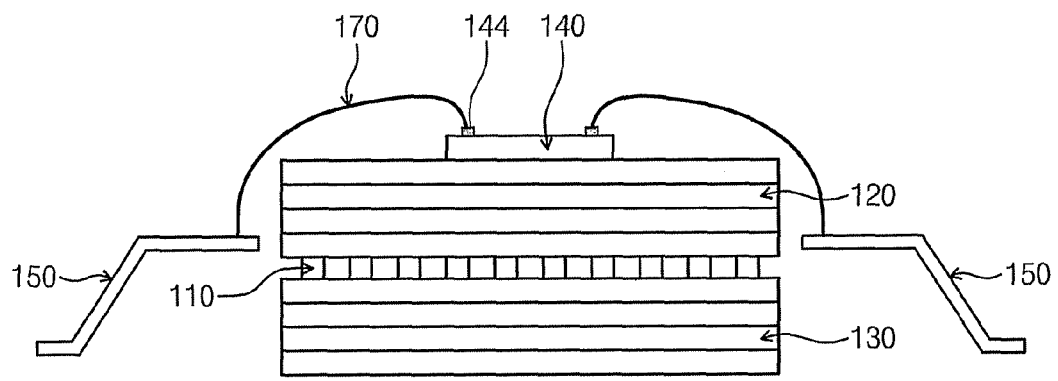

Referring to FIG. 8, a second bonding pad 144 of the third semiconductor chip 140 may be electrically connected to external connection terminals 150 that may be external input/output terminals through the bonding wire 170 in front and next processes while being electrically connected to the interposer lead 110.

Figure 9:
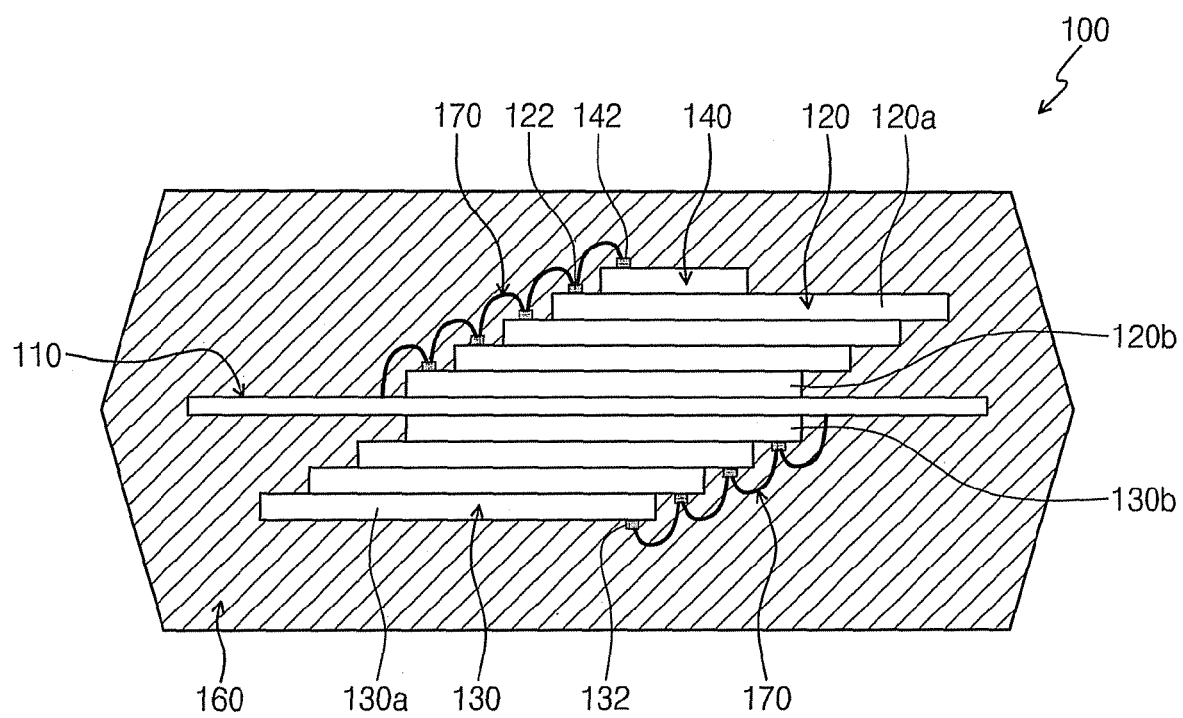

In example embodiments, as shown in FIG. 9, a molding resin 160 may cover the interposer leads 110, the first semiconductor chips 120, the second semiconductor chips 130, the third semiconductor chip 140, a portion of the respective external connection leads 150, and the bonding wires 170.

Figure 10:
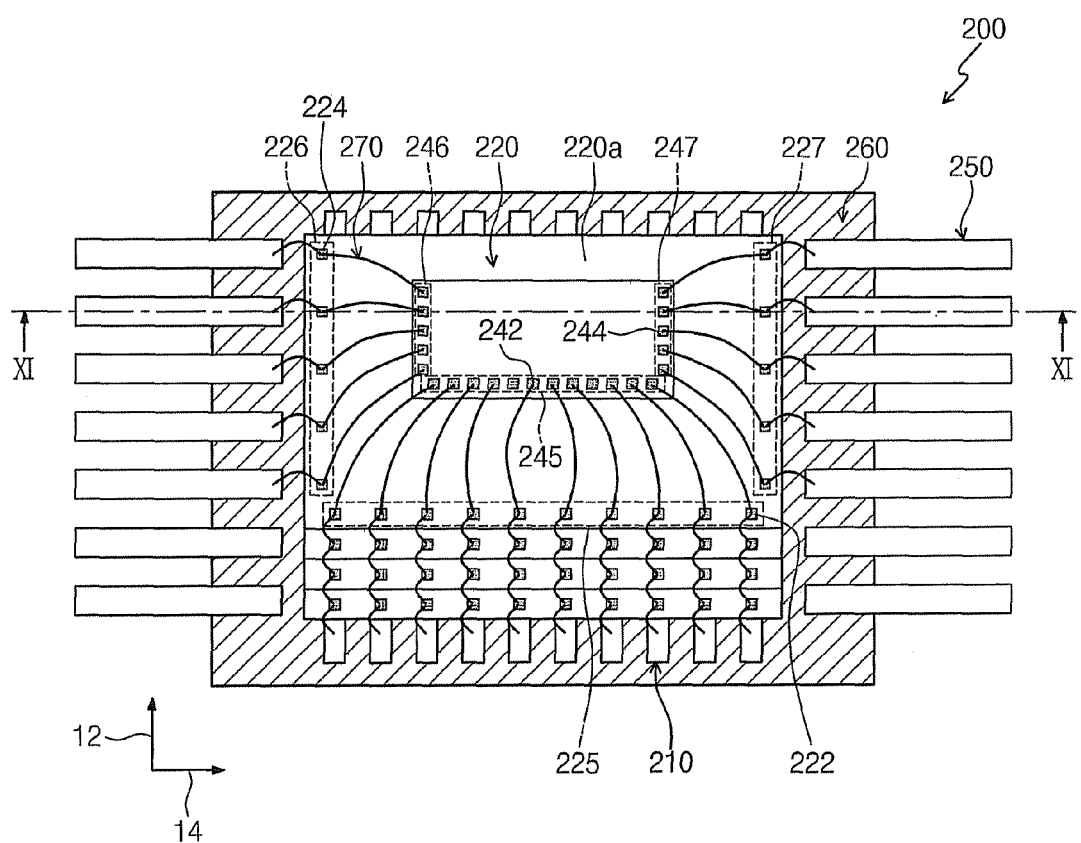
FIG. 10 is a schematic perspective view illustrating a stacked package of a semiconductor device according to example embodiments.
Figure 11:
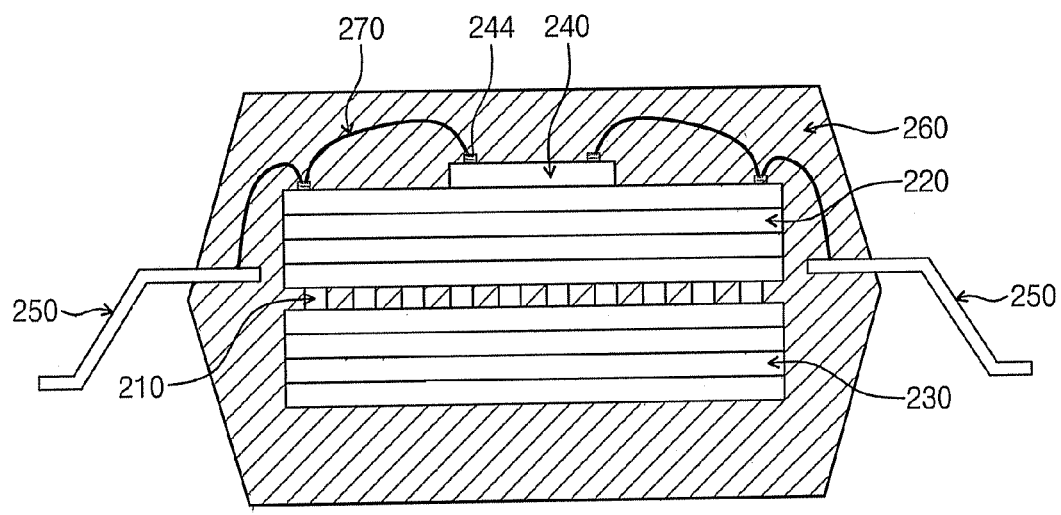
FIG. 11 is a sectional view taken along line XI-XI of FIG. 10.

The bonding pads 122, 132, and 142 of the first semiconductor chips 120, the second semiconductor chips 130, and the third semiconductor chip 140 may be formed using a redistributed layout formation technology to effectively perform the bonding wire process. FIGS. 10 and 11 are views illustrating a stacked package 200 of a semiconductor device to which the redistributed layout formation technology is applied according to example embodiments. FIG. 10 is a schematic perspective view illustrating the stacked package 200 of the semiconductor device, and FIG. 11 is a sectional view taken along line XI-XI of FIG. 10.

Referring to FIGS. 10 and 11, the stacked package 200 of the semiconductor device may have a structure similar to that of the stacked package 100 of the semiconductor device of FIG. 1. For example, the stacked package 200 may include a first semiconductor chips 220 and a third semiconductor chip 240 similar to the first semiconductor chips 120 and the third semiconductor chip 140 of the stacked package 100. Like the stacked package 100, the third semiconductor chip 240 may have a size less than a size of the first semiconductor chips 220. In example embodiments, because the third semiconductor chip 240 may have a size less than that of a first semiconductor chip 220a adjacent to the third semiconductor chip 240 among the first semiconductor chips 220, the first semiconductor chip 220a may further include dummy bonding pads 224. The dummy bonding pads 224 may be insulated from an internal circuit of the first semiconductor chip 220a. A distance between the dummy bonding pads 224 adjacent to each other may be greater than that between the adjacent second bonding pads 244 of the third semiconductor chip 240. When a region in which the dummy bonding pads 224 are disposed on the first semiconductor chip 220a is defined as a first edge region 225, the dummy bonding pads 224 may be disposed in a second edge region 226 perpendicular to the first edge region 225. The dummy bonding pads 224 may be arranged along a first direction 12. Also, the dummy bonding pads 224 may be arranged along the first direction 12 in a third edge region 227 facing the second edge region 226. Selectively, the dummy bonding pads 224 may be disposed around an edge of the third semiconductor chip 240 among the regions of the first semiconductor chips 220.

The second bonding pads 244 of the third semiconductor chip 240 may be electrically connected to external connection leads 250. For example, the second bonding pads 244 of the third semiconductor chip 240 may be electrically connected to the dummy bonding pads 224 of the first semiconductor chip 220a corresponding to the second bonding pads 244 of the third semiconductor chip 240 using the bonding wire 270. The dummy bonding pads 224 may be electrically connected to the external connection lead 250 corresponding to the dummy bonding pad 224 using the bonding wire 270. Since the dummy bonding pads 224 are provided, a length of the bonding wire 270 for electrically connecting the third semiconductor chip 240 to the external connection leads 250 may become short.

Other structures associated with the stacked structure 200 may be similar to structures associated with the stacked structure 100. For example, the stacked package 200 may include a third edge region 247, a molding resin 260, bonding pads 222, and interposer leads 210 similar to the third edge region 147, the molding resin 160, the bonding pads 122, and interposer leads 110 of the stacked package 100.

Figure 12:
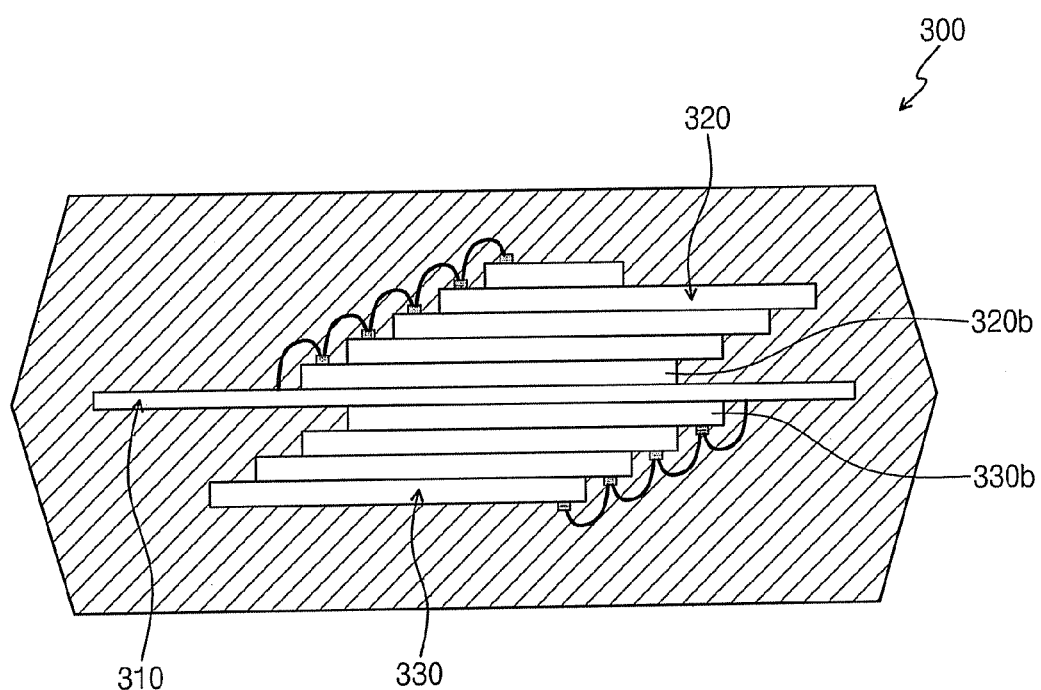
FIGS. 12 to 16 are sectional views illustrating modified examples of a stacked package of a semiconductor device, respectively.

Unlike the above described examples, in a stacked package 300 of a semiconductor device, a first semiconductor chip 320b most adjacent to an interposer lead 310 among first semiconductor chips 320 may partially overlap a second semiconductor chip 330b most adjacent to the interposer lead 310 among second semiconductor chips 330 when viewed from an upper side as shown in FIG. 12. In example embodiments, the second semiconductor chip 330b may be off-set with respect to the first semiconductor chip 320b in a direction in which the first semiconductors 320 are off-set with respect to each other.

Figure 13:
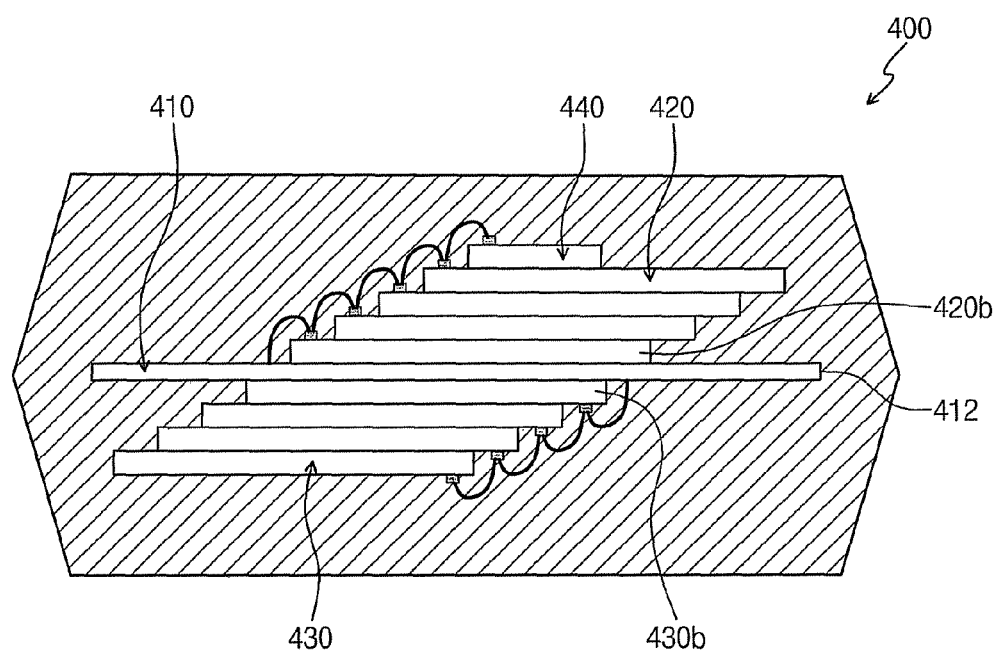

Alternatively, like a stacked package 400 of a semiconductor device of FIG. 13, a second semiconductor chip 430b most adjacent to an interposer lead 410 among second semiconductor chips 430 may be off-set with respect to a first semiconductor chip 420b most adjacent to the interposer lead 410 in a direction opposite to a direction in which first semiconductor chips 420 are off-set with respect to each other. For example, the second semiconductor chips 420 may be offset in a direction away from an end 412 of the interposer lead 410. Other structures in the stacked package 400 may be similar to the structures of the stacked package 100. For example, the stacked package 400 may include a third semiconductor chip 440.

Figure 14:
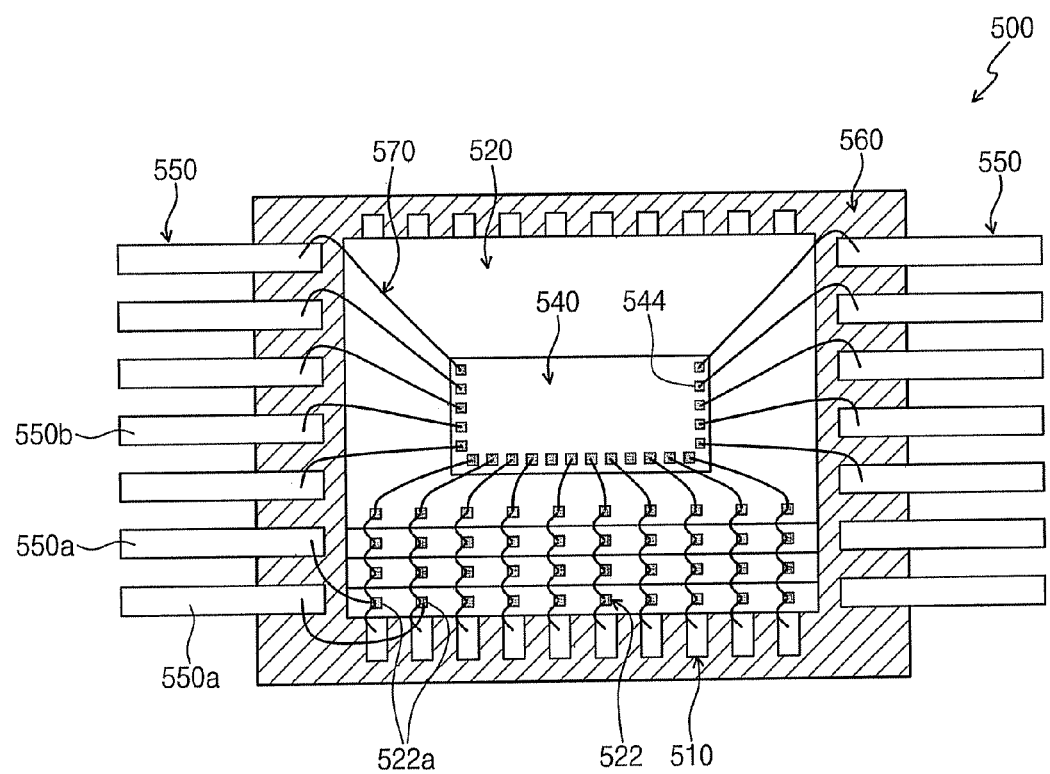

In example embodiments, a stacked package 500 of a semiconductor device shown in FIG. 14, may external connection leads 550 that include an external connection leads 550a that may be configured to perform power (i.e., power source) and ground functions. The external connection leads 550a may be directly connected to a corresponding power source bonding pad 522a among bonding pads 522 of a first semiconductor chip 520 or bonding pads of second semiconductor chips that may be on a bottom of the stacked package 500. The second semiconductor chips may be similar to any one of the second semiconductor chips 130, 230, 330, and 430 Also, the rest of the external connection leads 550b may be directly connected to second bonding pads 544 of a third semiconductor chip 540 by bonding wires 570. In example embodiments, the external connection leads 550a may be directly connected to the first semiconductor chips 520 and the second semiconductor chips except a first semiconductor chip 520a or a second semiconductor chip, which is disposed most adjacent to interposer leads using bonding wires.

Figure 15:
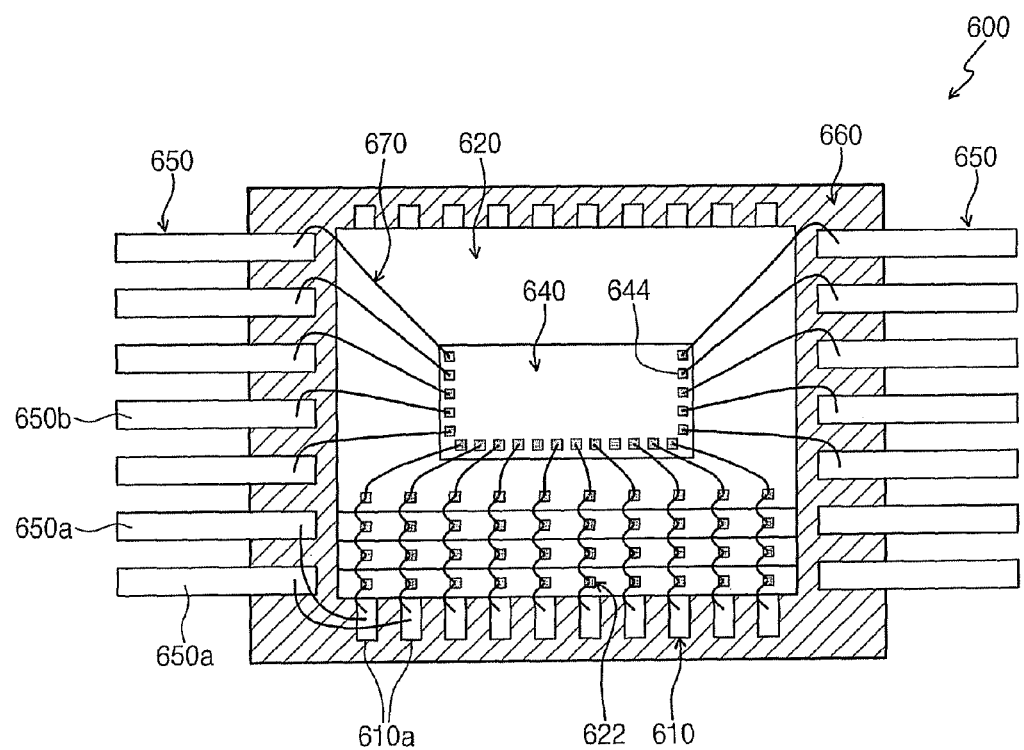

In example embodiments, a stacked package 600 of a semiconductor device shown in FIG. 15, may include external connection leads 650 that include external connection leads 650a configured to perform power (i.e., power source) and ground functions. The external connection leads 650a may be directly connected to an interposer lead 610a serving as a power source among interposer leads 610 using a bonding wire 670. The rest external connection leads 650b may be directly connected to second bonding pads 644 of a third semiconductor chip 640. Other structures illustrated in FIG. 15 may be similar to structures similar to structures of other example packages. For example, the stacked package 600 may include bonding pads 622 and first semiconductor chips 620 similar to the bonding pads 122 and the first semiconductor chips 120 of the semiconductor package 100.

Figure 16:
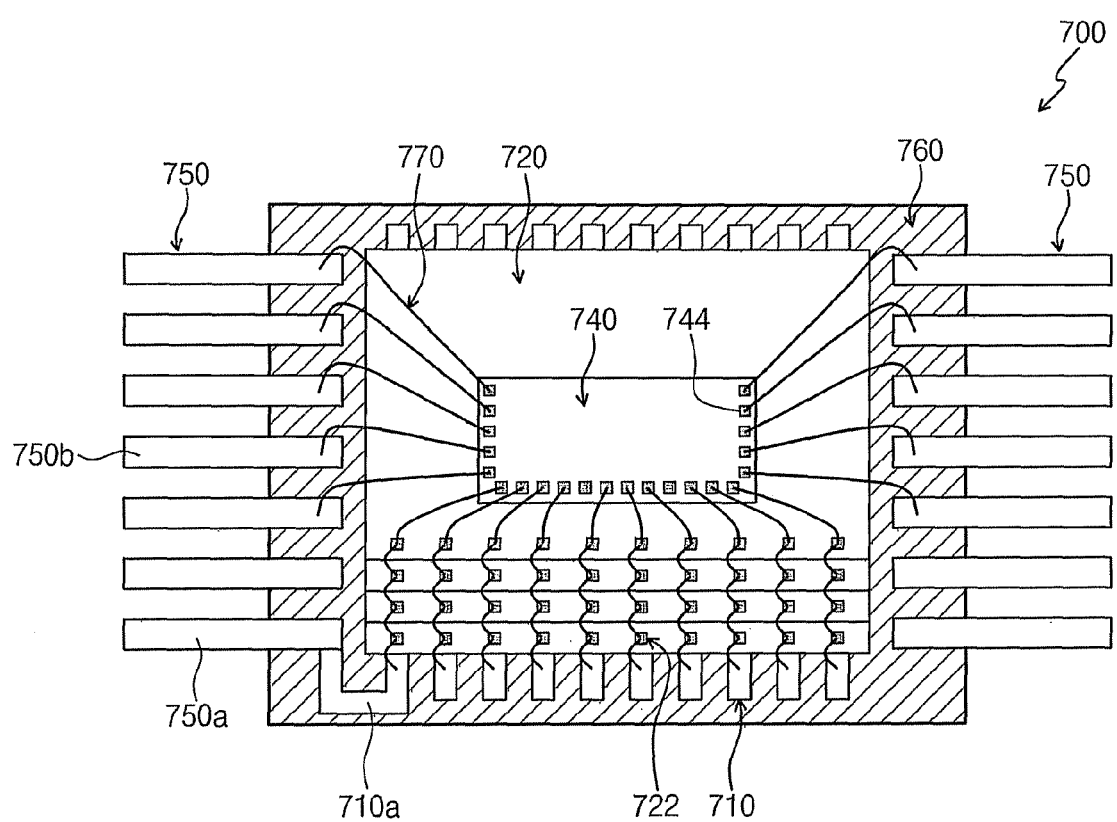

In example embodiments, a stacked package 700 of a semiconductor device shown in FIG. 16 may include an external connection lead 750a that performs power (i.e., power source) and ground functions among external connection leads 750 may be integrated with an interposer lead 710a serving as a power source among interposer leads 710. For example, the external connection lead 750b and the interposer lead 710a may be provided in one lead or directly connected to each other.

In the examples of FIGS. 14 to 16, the number of power connection leads that are connected to the interposer leads or the first or second semiconductor chips may be changed as shown in FIGS. 14 to 16.

As described above, the first semiconductor chips and the second semiconductor chips may be provided in plurality, respectively. However, example embodiments are not limited thereto as only one first semiconductor chip and only one second semiconductor chip may be provided. Also, as described above, the first semiconductor chips may have the same number as the second semiconductor chips. However, the number of the first semiconductor chips may be different from that of the second semiconductor chips.

Figure 17:
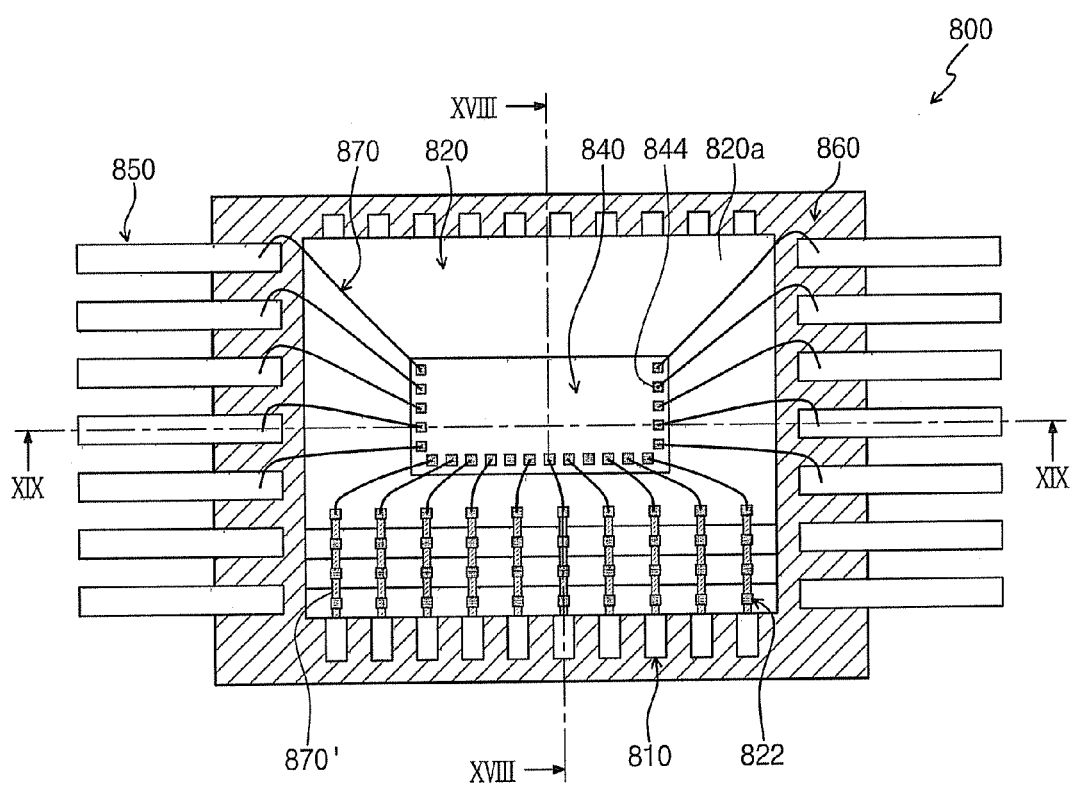
FIG. 17 is a schematic perspective view illustrating a stacked package of a semiconductor device according to example embodiments.
Figure 18:
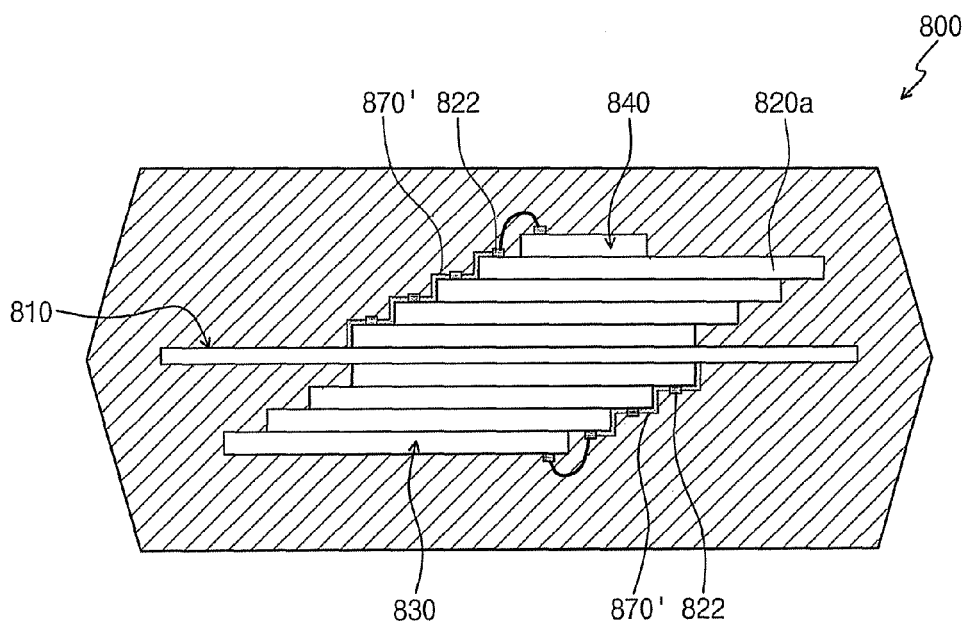
FIG. 18 is a sectional view taken along line XVIII-XVIII of FIG. 17.
Figure 19:
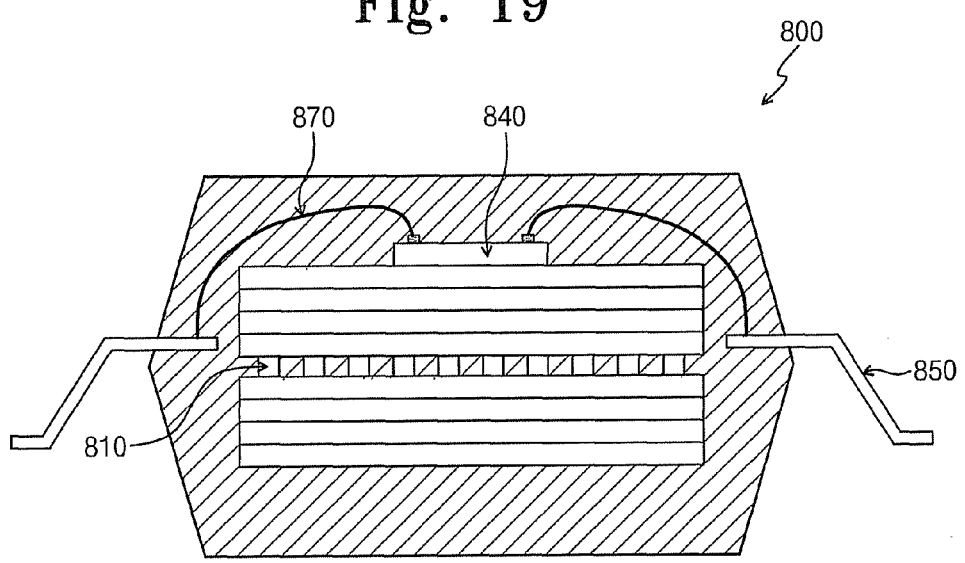
FIG. 19 is a sectional view taken along line XIX-XIX of FIG. 17.

FIGS. 17-19 illustrate a stacked package 800 in accordance with example embodiments. The stacked package 800 is similar to the stacked package 100 illustrated in FIGS. 1-3 in that the stacked package 800 includes a plurality of external connection leads 850, a plurality of interposer leads 810, a plurality of first semiconductor chips 820, bonding wires 870, a third semiconductor chip 840, bonding pads 844 and 822, a plurality of second semiconductor chips 830, and a mold resin 860 each of which is similar to semiconductor package 100's plurality of external connection leads 150, plurality of interposer leads 110, plurality of first semiconductor chips 120, bonding wires 170, third semiconductor chip 140, bonding pads 144 and 122, plurality of second semiconductor chips 130, and mold resin 160, respectively. However, rather than connecting the semiconductor chips 820 and 830 to one another using a bonding wire, a conductive pattern 870' may be formed on surfaces of the semiconductor chips 830 and 840. As shown in FIG. 18, the conductive pattern 870' may be step shaped and may connect to pads 822 formed on the surfaces of the semiconductor chips 820 and 830 to the interposers 810.

The above-disclosed subject matter is to be considered illustrative and not restrictive, and the appended claims are intended to cover all such modifications, enhancements, and other embodiments, which fall within the true spirit and scope of example embodiments. Thus, to the maximum extent allowed by law, the scope of example embodiments is to be determined by the broadest permissible interpretation of the following claims and their equivalents, and shall not be restricted or limited by the foregoing detailed description.

What is claimed is:

1. A stacked package of a semiconductor device, comprising:
    at least one first semiconductor chip configured to perform a first function, the at least one first semiconductor chip including a first plurality of bonding pads;
    at least one second semiconductor chip configured to perform a second function, the at least one second semiconductor chip being arranged under the at least one first semiconductor chip and including a second plurality of bonding pads;
    at least one interposer lead between the at least one first semiconductor chip and the at least one second semiconductor chip;
    a third semiconductor chip configured to perform a third function which is different from the first and the second functions, the third semiconductor chip being arranged on the first semiconductor chip and including a third plurality of bonding pads;
    external connection leads configured to electrically connect the third plurality of bonding pads to an outside; and
    a wire bonding unit electrically connecting the at least one first semiconductor chip, the at least one second semiconductor chip, the third semiconductor chip, the at least one interposer lead, and the external connection leads to each other,
    wherein the at least one interposer lead is configured to provide an electrical connection media between the at least one first semiconductor chip and the at least one second semiconductor chip,
    wherein each of the at least one first semiconductor chip, the at least one second semiconductor chip, and the at least one interposer lead is provided in plurality, and the first semiconductor chips and the second semiconductor chips are stacked in an off-set stair type and the interposer leads are electrically separated from each other.

2. The stacked package of claim 1, wherein the at least one first semiconductor chip and the at least one second semiconductor chip include memory semiconductors.

3. The stacked package of claim 2, wherein the third semiconductor chip includes a memory controller semiconductor.

4. The stacked package of claim 1, wherein at least one of the external connection leads is configured to serve as a power source and the at least one of the external connection, leads configured to serve as a power source is directly connected to a power bonding pad among at least one of the first plurality of bonding pads and the second plurality of bonding pads using a bonding wire.

5. The stacked package of claim 1, wherein at least one of the external connection leads is configured to serve as a power source and the at least one of the external connection leads configured to serve as the power source is directly connected to the at least one interposer lead using at least one bonding wire.

6. The stacked package of claim 1, wherein at least one of the external connection leads is configured to serve as a power source and the at least one of the external connection leads configured to serve as the power source is integrated with the at least one interposer lead.

7. The stacked package of claim 1, wherein the wire bonding unit includes a bonding wire.

8. The stacked package of claim 7, wherein the wire bonding unit is configured as a jumping bond through which the bonding pads are connected to each other.

9. The stacked package of claim 1, further comprising:
    a molding resin covering at least a portion of the external connection leads, the at least one first semiconductor chip, the at least one second semiconductor chip, the third semiconductor chip, and the at least one interposer lead.

10. The stacked package of claim 1, wherein the plurality of first semiconductor chips are off-set toward one end of the interposer leads as the plurality of first semiconductor chips are away from the interposer leads, and the plurality of second semiconductor chips are off-set toward another other end of the interposer leads as the plurality of second semiconductor chips are away from the interposer leads.

11. The stacked package of claim 1, wherein
the first plurality of bonding pads are aligned in a row along an edge of the at least one first semiconductor chip and on a surface of the at least one first semiconductor chip that faces away from the at least one interposer lead, and
the second plurality of bonding pads are aligned in a row along an edge of the at least one second semiconductor chip and on a surface of the at least one second semiconductor chip that faces away from the at least one interposer lead.

12. The stacked package of claim 1, wherein at least one bonding pad of the first, the second, and the third plurality of bonding pads includes a redistributed layout pad.

13. The stacked package of claim 1, wherein the at least one interposer lead is a plurality of interposer leads and each interposer lead of the plurality of interposer leads has a bar shape, and each interposer lead of the plurality of interposer leads are spaced from each other and arranged in a row along a direction perpendicular to a longitudinal direction of the interposer leads.

14. The stacked package of claim 1, wherein the external connection leads are configured to not electrically connect the first and second plurality of bonding pads to the outside.

15. A stacked package of a semiconductor device, comprising:
at least one first semiconductor chip configured to perform a first function, the at least one first semiconductor chip including a first plurality of bonding pads;
at least one second semiconductor chip configured to perform a second function, the at least one second semiconductor chip being arranged under the at least one first semiconductor chip and including a second plurality of bonding pads;
at least one interposer lead between the at least one first semiconductor chip and the at least one second semiconductor chip;
a third semiconductor chip configured to perform a third function which is different from the first and the second functions, the third semiconductor chip being arranged on the first semiconductor chip and including a third plurality of bonding pads;
external connection leads configured to electrically connect the third plurality of bonding pads to an outside; and
a wire bonding unit electrically connecting the at least one first semiconductor chip, the at least one second semiconductor chip, the third semiconductor chip, the at least one interposer lead, and the external connection leads to each other,
wherein the at least one interposer lead is configured to provide an electrical connection media between the at least one first semiconductor chip and the at least one second semiconductor chip,
wherein at least one bonding pad of the first, the second, and the third plurality of bonding pads includes a redistributed layout pad, and
wherein the third semiconductor chip has a size less than those of the at least one first semiconductor chip and the at least one second semiconductor chip.

16. The stacked package of claim 15, wherein the at least one first semiconductor chip is adjacent to the third semiconductor chip and the at least one first semiconductor chip includes at least one dummy bonding pad, and the at least one dummy bonding pad is directly connected to at least one bonding pad of the third plurality of bonding pads and the external connection leads by a bonding wire.

17. The stacked package of claim 16, wherein the at least one dummy bonding pad is in an edge region of the at least one first semiconductor chip perpendicular to an edge region in which the plurality of first bonding pads is disposed.

18. The stacked package of claim 14, wherein the external connection leads are configured to not electrically connect the first and second plurality of bonding pads to the outside.

* * * * *